United States Patent [19]

Cline

[11] Patent Number: 4,590,130

[45] Date of Patent: May 20, 1986

[54] SOLID STATE ZONE RECRYSTALLIZATION OF SEMICONDUCTOR MATERIAL ON AN INSULATOR

[75] Inventor: Harvey E. Cline, Schenectady, N.Y.

[73] Assignee: General Electric Company, Schenectady, N.Y.

[21] Appl. No.: 593,064

[22] Filed: Mar. 26, 1984

[51] Int. Cl.⁴ .......................... B32B 9/04; B32B 9/00; B32B 19/00
[52] U.S. Cl. .................................. 428/446; 428/700; 428/448
[58] Field of Search .............. 428/446, 700, 704, 701, 428/448

[56] References Cited

U.S. PATENT DOCUMENTS

| | | | |
|---|---|---|---|
| 3,393,088 | 7/1968 | Manasevit et al. | 428/446 |
| 3,414,434 | 12/1968 | Manasevit | 428/446 |
| 4,177,321 | 12/1979 | Nushizawa | 428/700 X |
| 4,320,178 | 3/1982 | Chemla et al. | 428/700 X |
| 4,442,178 | 4/1984 | Kimura et al. | 428/446 |
| 4,447,497 | 5/1984 | Manasevit | 428/700 X |

*Primary Examiner*—George F. Lesmes
*Assistant Examiner*—Nancy A. B. Swisher
*Attorney, Agent, or Firm*—James Magee, Jr.; James C. Davis, Jr.

[57] ABSTRACT

Dielectrically isolated, thin single crystal films of semiconductor material suitable for integrated circuit applications and preparation thereof by solid state zone recrystallization of a polycrystalline layer of the semiconductor material are disclosed.

8 Claims, 5 Drawing Figures

LINE HEATER

MOTION →

SOLID STATE ZONE RECRYSTALLIZATION OF SEMICONDUCTOR MATERIAL ON AN INSULATOR

This invention is related to the fabrication of dielectrically isolated layers of semiconducting material most usually exemplified by silicon-on-insulator (SOI) laminate material.

Primary efforts to date have been directed toward the production of SOI material with the objective of providing the layer, or film, of silicon as single crystal material.

The following definitions are intended to clarify the manner in which these terms apply to the invention described herein;

SINGLE CRYSTAL

By the term single crystal it is meant that the crystal consists of a lattice of atoms having a specific orientation relative to each other within an accuracy of less than one degree. Defects, such as dislocations or slight misorientation, may occur in the lattice, but the planes of atoms must be parallel to within one degree.

GRAIN

If a region of single crystal material is misoriented by more than one degree from the surrounding material, then this region is denoted as being a grain. A body containing a plurality of grains is considered to be a poly crystal. The boundary between adjacent grains is a surface called a grain boundary. Any material containing grain boundaries is not a single crystal.

SUB GRAIN

A single crystal that is not a perfect (i.e. without defects) single crystal may contain regions which are misoriented by less than one degree from the adjacent material. Such regions are called sub grains and the surfaces between such regions are called sub grain boundaries, or low angle grain boundaries. A crystal meeting these criteria although imperfect is considered a single crystal. For the purposes of making majority carrier devices, a crystal containing sub boundaries may be used (i.e. it will be suitable for integrated circuit applications). However, it is preferable to eliminate all sub boundaries and produce a perfect defect-free single crystal to achieve maximum flexibility in the fabrication of electronic circuits.

SUBSTANTIALLY UNIFORM THICKNESS

A layer, or film, in which the thickness varies no more than ±5% from the nominal thickness is considered to have a substantially uniform thickness.

Certain features distinguish a single crystal made by solid state zone recrystallization from a single crystal made by zone melting. Thus, when low angle grain boundaries are present in each, while such features are randomly oriented in the former case, these features are aligned in what appears to be a columnar orientation in the latter. Thin single crystals produced by this invention are of substantially uniform thickness, while single crystal produced by zone melting are not flat and, therefore, of varying thickness. Also, in the process of zone melting of poly silicon, the molten silicon has a greater solubility for oxygen (from adjacent oxide layers) than films recrystallized in the solid state. As a result oxygen is present as an impurity in larger amounts in single crystals formed by zone melting.

At present two commercially available structures provide dielectrically isolated films of semiconductor material. The first, which is referred to as a dielectric isolation (DI) wafer is used for the preparation of power devices. In the process by which DI structures are prepared, a single crystal of silicon (i.e. a silicon wafer) is etched and then oxidized to produce a dielectric oxide layer on one major surface. A thick layer of poly silicon is deposited over the oxide layer. Next, the thickness of the original silicon wafer is reduced by grinding and polishing to a layer of single crystal silicon having a thickness ranging from about 10 to about 50 microns. Subsequently, this silicon layer is converted to a plurality of isolated tubs (i.e. single crystal regions of silicon) that may be used to form devices. Because of the difficult procedure of grinding away the silicon from the original wafer, the product is limited to the production of single crystal regions of silicon having a thickness of greater than 10 microns. Wafer bow is a problem in obtaining a substantially uniform silicon film.

The second commercially available structure providing dielectrically isolated silicon is silicon-on-sapphire (SOS) prepared by forming an epitaxial layer of silicon on a sapphire substrate by chemical vapor deposition. Isolated integrated circuits can then be formed on the single crystal silicon. This structure is expensive and its use is usually limited to military applications.

The art will particularly benefit from the availability of dielectrically isolated thin single crystal films of semiconductor material, such as SOI material, because of the ease with which electrical isolation can be established between different parts of a circuit fabricated on the single crystal. Such dielectric isolation in electronic circuits prevents troublesome latchup, eliminates cross talk, reduces parasitic capacitance, increases packing density, provides radiation hardness and eases the problem of isolating signal circuits from power circuits. Thus it becomes feasible to integrate signal devices (operating at about 5 volts) and power devices (operating at about 1000 volts) in the same circuit.

DESCRIPTION OF THE INVENTION

A thin encapsulated polycrystalline film of a semiconductor material is zone heated in the solid state to a temperature below the melting point of the semiconducting material at which the polycrystalline film is converted to single crystal semiconductor material. The requisite heating is provided by the joint application of underlying constant temperature heat and superimposed transient heating contributed by a moving line of heat from a lamp/reflector combination apparatus. However, the temperature exposure of each portion of the polycrystalline film should be substantially the same. The width of the line of heat is sharply defined to a maximum width of 3 mm or less. The velocity of the movement of the line of heat relative to the encapsulated film such as will produce single crystal material increases inversely as a function of the thickness of the encapsulated film being converted and varies inversely to the level of temperature reached by the encapsulated film during the transient zone heating. Thinner films may be recrystallized at higher rates than thicker films. Thus, with the maximum temperature at about 1400° C., a polycrystalline film 100 Angstroms in thickness can be converted to single crystal material utilizing a velocity ranging from about 0.05 to about 0.25 cm/sec. At the same temperature, a film of polycrystalline material 5000 Angstroms thick can be converted to single crystal material by employing a much reduced velocity in the range of from about 0.001 to about 0.005 cm/sec. The area of single crystal material generated will be as large as the underlying wafer substrate, typically about 3 inches or more in diameter using suitable temperature control to avoid melting. Chips cut from the completed structure may be dimensioned ½ to 1 millimeter on a side.

Once the single crystal film has been formed, the encapsulating material is removed. If the thickness of the single crystal semiconductor material is insufficient for the intended application (e.g. power devices) the thickness can be epitaxially built-up with additional semiconductor material. The process of solid state zone recrystallization can be carried out either before or after the introduction of impurity materials therein. In the case of epitaxial build-up of the single crystal, the initial crystal material and the epitaxially deposited material need not be identical, i.e. one or the other or both may have had impurity atoms deliberately introduced therein. The orientation of the single crystal film is <010> (100), the <010> indicating direction and the (100) indicating plane. The semiconductor material employed is selected from the group consisting of silicon, gallium arsenide, indium antimonide and germanium. Materials typically used as substrates to support the dielectrically isolated semiconductor material are silicon, quartz and sapphire.

In the production of thin single crystal silicon films, a typical substrate would be a silicon wafer. If it is desired to have the crystallographic orientation of the silicon substrate and the single crystal silicon film be the same, then it is necessary to provide for seeding from the silicon wafer to the polycrystalline silicon being converted by solid state zone recrystallization.

BRIEF DESCRIPTION OF THE DRAWING

The features of this invention believed to be novel and unobvious over the prior art are set forth with particularity in the appended claims. The invention itself, however, as to the organization, method of operation and objects and advantages thereof, may best be understood by reference to the following description taken in conjunction with the accompanying drawing wherein:

METHOD AND PROCESS OF MAKING AND USING THE INVENTION

The following description is directed to the preparation of thin single crystal silicon films. These teachings, however, are broadly applicable to the preparation of thin single crystal semiconductor material films.

Figure 1:
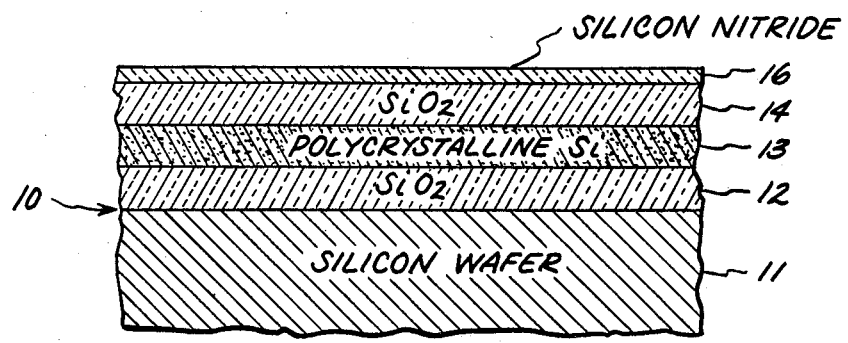
FIG. 1 is a schematic view in section of an encapsulated polycrystalline silicon film supported on a silicon wafer preparatory to exposure thereof to zone heating for the solid state recrystallization of the polycrystalline layer to single crystal material.
Figure 2:
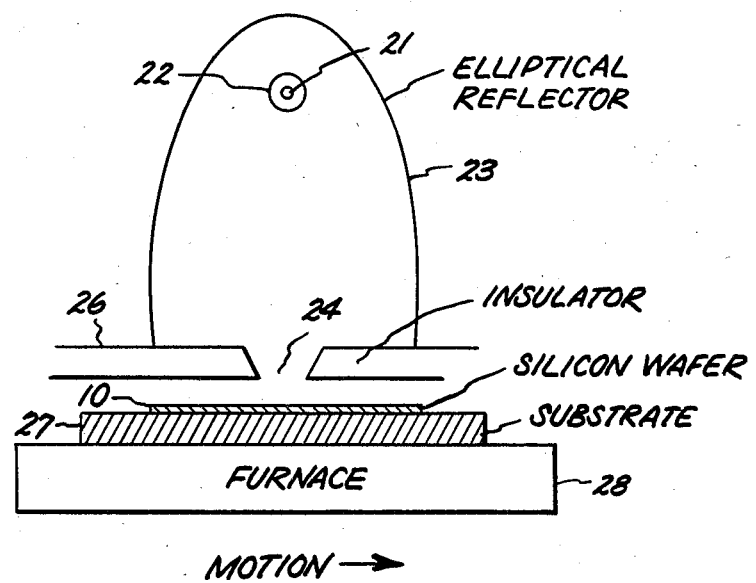
FIG. 2 is a schematic view in section of the zone heating apparatus.

Laminate 10 of FIG. 1 was prepared by thermally oxidizing a silicon wafer 11 (typically 7.5 cm in diameter and 0.038 cm thick) to produce dielectric layer 12, of amorphous silicon oxide typically 1 micron in thickness. A thin (100–5000 Angstroms) poly silicon layer 13 was then deposited over layer 12 by low pressure chemical vapor deposition at 633° C. The requisite covering to protect layer 13 during the solid state zone recrystallization consists of silicon dioxide layer 14 (about 1.5 microns in thickness) applied by chemical vapor deposition at 900° C. and, if extra protection is needed, a layer 16 of silicon nitride (about 0.03 microns thick) can be applied.

A line of heat of uniform width (about 1 to 3 mm wide) is produced by focusing the filament 21 of a quartz iodine lamp 22 (typically 25 cm long) onto the surface of laminate 10 using the highly polished elliptical reflector 23 made of aluminum. The heat zone impinging upon the surface of laminate 10 was masked by slit 24 (0.8 cm wide) in insulating sheet 26 to increase the thermal gradient and restrict the radiant heat from lamp 22 to the desired long, narrow linear heat zone. Laminate 10 is supported on substrate 27 of graphite coated with silicon carbide. Substrate 27 is moved with respect to the line of heat at a constant velocity. The silicon carbide coating is used to minimize contamination by carbon.

Substrate 27 is heated by resistance furnace 28 to a temperature of about 1100° C. in order to reduce the thermal gradient between the temperature of the silicon wafer 11 prior to and during zone heating.

The power of the lamp is increased until the narrow heat zone (e.g. about 1 mm wide) subjects polycrystalline silicon layer 13 to a temperature level higher than about 1100° C. but lower than the temperature level at which silicon melts (about 1412° C.). Power supplied to lamp 22 should be carefully monitored to avoid temperature incursions, which will cause melting of the polycrystalline silicon.

After completion of the exposure of laminate 10 to the solid state zone recrystallization temperature exposure, encapsulating layers 14 and 16 are removed chemically with a nitride etch followed by buffered hydrogen fluoride. The surface of the recrystallized thin film was reflective, smooth and had a mirror-like surface. Under the microscope it was observed that there were very many shallow grooves in the crystal surface appearing to define grain boundaries. It was later determined that as long as the proper conditions of temperature and velocity were maintained for the given thickness of polycrystalline silicon layer 13, the recrystallized layer is, in fact, single crystal silicon over the extent of the surface area treated. This determination was made by a series of characterization techniques including the use of a scanning electron microscope, electron channeling apparatus and electron transmission microscopy.

Thus, an electron channelling pattern of a 100 micron size region of a zone recrystallized thin film of silicon prepared according to this invention shows the film to be a single crystal. The orientation of the film is parallel to the (100) plane.

A 0.5 micron thick film of silicon was zone recrystallized at 0.005 cm/sec at 1400° C. The film was examined in the electron transmission microscope and was found to consist of 100 micron size sub grains. Selective area electron diffraction was used to measure the film orientation. The film was parallel to the (100) plane and misorientations across the sub grain boundaries were less than one degree.

Another poly silicon film was recyrstallized at a higher rate (0.01 cm/sec) at about 1400° C. In this case, small included cylindrically-shaped grains were observed in electron transmission microscopy. Thus, for the case of one-half micron thick silicon films recrystallized just below the melting point of silicon, the critical rate for producing single crystal films was found to be less than about 0.005 cm/sec. At some velocity between 0.005 and 0.01 cm/sec there is a transition velocity such that slower velocities produce single crystal material and faster velocities produce polycrystalline material.

Figure 3:
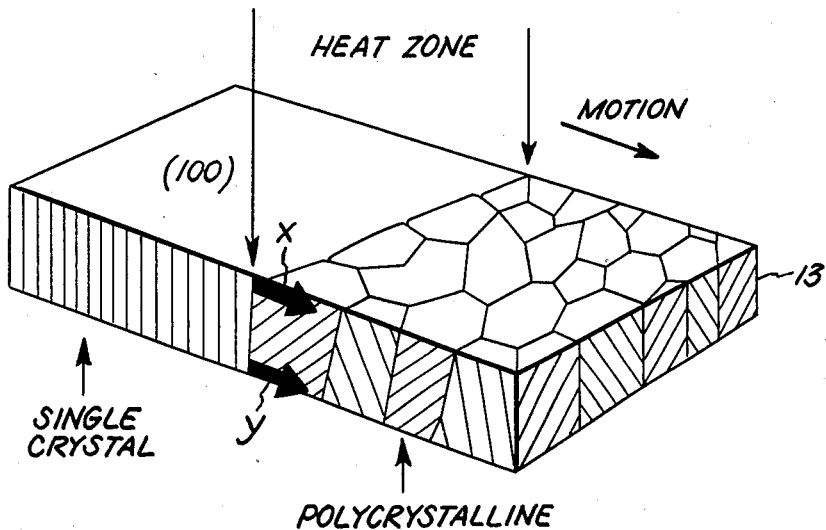
FIG. 3 is a schematic three dimensional view of the layer, or film, of semiconductor material partially converted to single crystal material.

The as-deposited poly silicon thin film 13 contains a fine 0.03 micron columnar grain structure. FIG. 3 schematically illustrates the conversion from polycrystalline to single crystal material as a result of the movement of the heat zone in the direction shown. Upon being subjected to the narrow linear heat zone, differences in the surface energies at the interfaces of layer 13 with silicon oxide layers 12 and 14 predominate as the driving force converting the polycrystalline material to single crystal material. The presence of the surface energies at these interfaces is indicated by arrows X and Y. Since the (100) orientation has the lowest surface energy, the developing single crystal grows into any off-axis grain to minimize the total surface energy. The <010> (100) orientation is selected by the system over other possible orientations during the process of zone heating. To the extent sub grain regions develop, they are oriented less than one degree from the predominant <010> direction.

Figure 4:
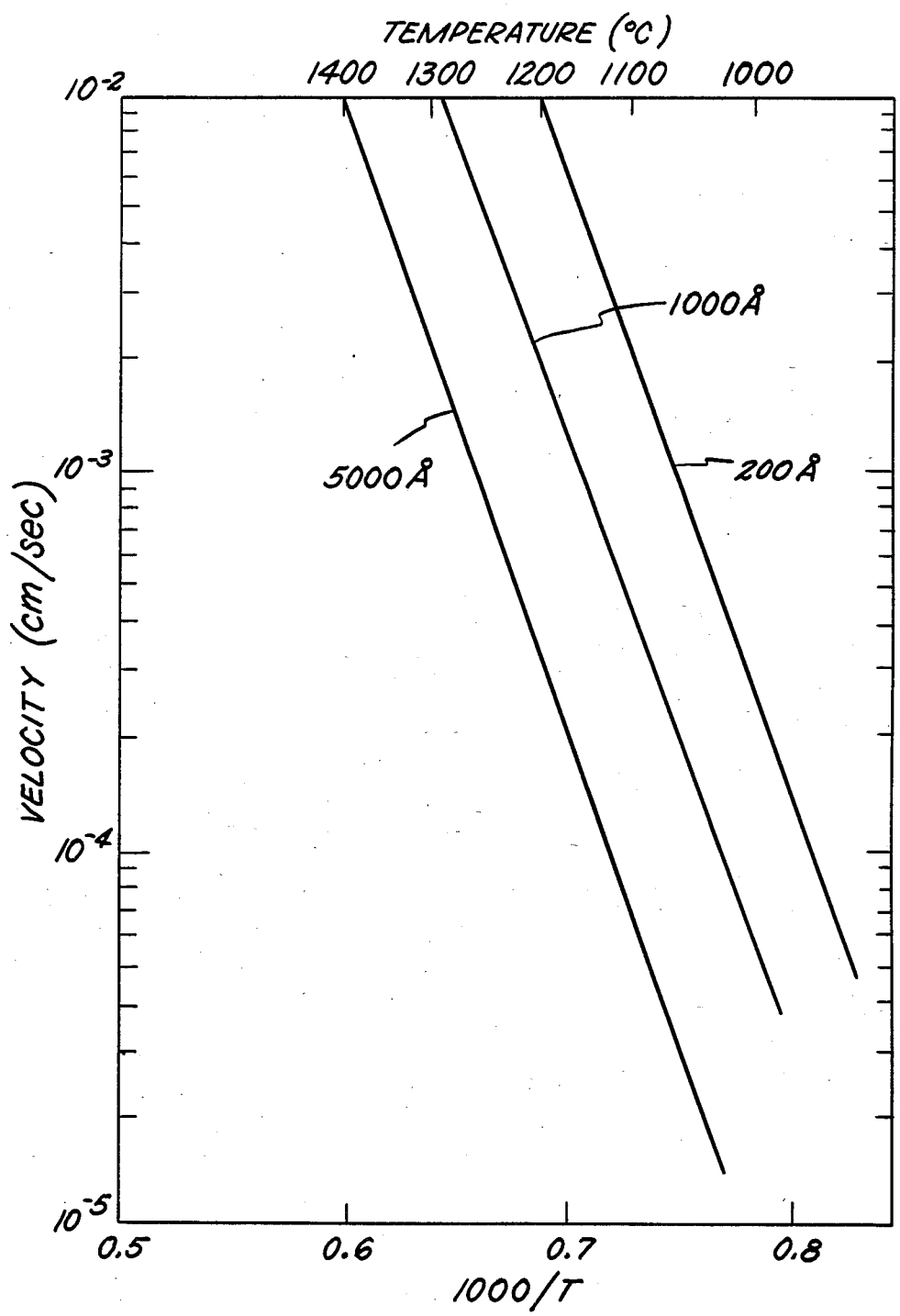
FIG. 4 is a graphic representation of the interrelation between the parameters of polycrystalline film thickness, maximum zone heat temperature and velocity of the moving line of heat

The dependence of the critical velocity at and below which single crystal material forms on both temperature and film thickness is plotted in FIG. 4. Thinner (100–500 Angstroms) films are expected to give reasonable recrystallization rates at lower temperatures. Operation at such lower temperatures presents distinct advantages:

a. the need for layer 16 may be obviated and a less thick layer 14 may suffice, both of which simplify wafer preparation;
b. process control is not as critical and
c. the lower processing temperatures favor wafer flatness and reduced impurity contamination.

For example, the dielectric oxide and cap layers 12 and 14 are sources of oxygen. By utilizing solid phase zone recrystallization contamination by oxygen is greatly decreased. The solubility of oxygen in the solid silicon decreases even further with decreasing operating temperature.

As dimensions of integrated circuits are reduced below a micron, ever thinner silicon films will be required. Surface energy driven crystal growth is more rapid for thin films indicating that processing should improve commensurately.

Figure 5:
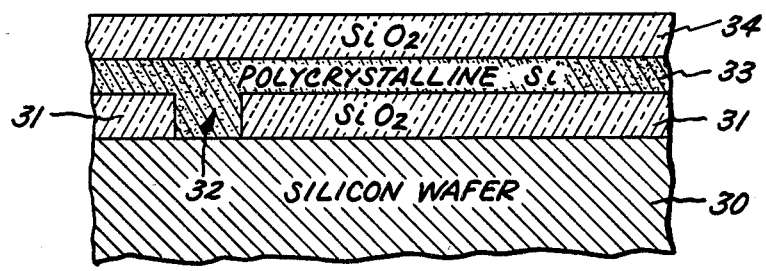
FIG. 5 is a schematic view in section of an encapsulated polycrystalline silicon film provided with an arrangement whereby the recrystallization of the silicon film will occur from seeding originating in the silicon wafer substrate.

In those instances in which it is preferable to have the thin single crystal silicon layer and the silicon wafer substrate have identical crystal orientation, an arrangement such as is shown in FIG. 5 may be prepared and zone heated. As in the case of the process yielding the laminate structure of FIG. 1, silicon wafer 30 is subjected to thermal oxidation to produce the silicon dioxide dielectric layer 31. One or more windows 32 are opened (i.e. formed by etching) through oxide layer 31 to permit the development of seed growth from substrate wafer 30 to the poly silicon film 33 applied thereover and filling window(s) 32 by chemical vapor deposition. Encapsulation with chemically vapor deposited silicon dioxide protects layer 33 and completes the laminated structure as shown. By the conduct of solid state zone recrystallization layer 33 is converted to single crystal silicon having the same orientation as the single crystal silicon wafer 30.

Whether or not seeding is employed to generate the thin (about 5000 Angstroms maximum) single crystal silicon layer, in order to introduce high voltage devices, additional silicon is epitaxially deposited on the recrystallized silicon after removal of the cap. Sidewall isolation is made by groove etching and then backfilling with dielectric material.

To accomplish solid state zone recrystallization of any of the semiconductor materials, it is preferable that the composition of the encapsulating layer contiguous with the polycrystalline layer should be the same as the composition of the dielectric layer. The dielectric layer must have a thermal expansion coefficient that has a value at least within 50% of the thermal expansion coefficient of the semiconductor material. Further, it should be chemically inert and be able to withstand voltage applications as high as 1000 volts.

The substrate for the laminate structure should be chemically inert, be able to retain its integrity during the high temperature exposure, be substantially flat and have an acceptable match of thermal expansion coefficients. Typical substrate materials are silicon, sapphire, and quartz. For certain applications, quartz is preferred since it is transparent. Shown in Table I are the thermal coefficients of expansion of the above-noted substrate materials and several semiconductor materials, which can be used therewith. Quartz ($SiO_2$) and sapphire ($Al_2O_3$) are illustrative of the range of thermal expansion coefficients that provide a reasonable match with the semiconductor materials shown.

TABLE I

| Linear Coefficient of Thermal Expansion (in/in/°F.) | |
|---|---|
| Ge | $5.8 \times 10^{-6}$ |
| Si | $2.5 \times 10^{-6}$ |
| GaAs | $5.9 \times 10^{-6}$ |
| $SiO_2$ | $.5 \times 10^{-6}$ |
| $Al_2O_3$ | $8.7 \times 10^{-6}$ |

After conduct of the solid state zone recrystallization and removal of the cap, very large scale integration (VLSI) devices are fabricated directly on the single crystal film to decrease parasitic capacitance and increase device speed. For VLSI devices, a thin single crystal silicon film on oxide will provide better device properties than silicon-on-sapphire wafers and at a much lower cost.

What is claimed is:

1. In a laminated article of manufacture comprising a dielectrically isolated film of crystalline semiconductor material supported on a substrate, said substrate and said crystalline film being separated by an amorphous dielectric layer, the improvement wherein said crystalline film is a single crystal and has a substantially uniform thickness in the range of from 100 to about 10,000 Angstroms, said thickness varying no more than ±5% from a nominal thickness, and any sub grain boundaries present in said single crystal are not aligned but are not randomly oriented.

2. The improvement of claim 1 wherein the maximum thickness of the single crystal film is about 5000 Angstroms.

3. The improvement of claim 1 wherein the material of the single crystal film is silicon, the material of the dielectric layer is silicon dioxide and the substrate is silicon.

4. The improvement of claim 1 wherein the orientation of the single crystal film is <010> (100).

5. The improvement of claim 1 wherein the substrate is single crystal material and the substrate and the single crystal film have the same crystal orientation.

6. The improvement of claim 1 wherein the semiconductor material is selected from the group consisting of silicon, gallium arsenide, indium antimonide and germanium.

7. The improvement of claim 1 wherein the crystalline film contains low angle grain boundaries.

8. The improvement of claim 1 wherein the crystalline film is substantially free of low angle grain boundaries.

* * * * *

UNITED STATES PATENT AND TRADEMARK OFFICE
CERTIFICATE OF CORRECTION

PATENT NO. : 4,590,130
DATED : May 20, 1986
INVENTOR(S) : Harvey E. Cline

It is certified that error appears in the above-identified patent and that said Letters Patent is hereby corrected as shown below:

Column 6, line 67, "not" should be deleted.

Signed and Sealed this

Twenty-third Day of September 1986

[SEAL]

Attest:

DONALD J. QUIGG

Attesting Officer     Commissioner of Patents and Trademarks

UNITED STATES PATENT AND TRADEMARK OFFICE
CERTIFICATE OF CORRECTION

PATENT NO. :   4,590,130
DATED      :   May 20, 1986
INVENTOR(S) :  Harvey E. Cline It is certified that error appears in the above-identified patent and that said Letters Patent is hereby corrected as shown below:

Claim 1: Column 6, line 67, delete the second occurrence of "not".

This certificate supersedes Certificate of Correction issued September 23, 1986.

Signed and Sealed this

Sixth Day of January, 1987

*Attest:*

DONALD J. QUIGG

*Attesting Officer*   *Commissioner of Patents and Trademarks*